(12) United States Patent
Park et al.

(10) Patent No.: US 11,262,861 B2
(45) Date of Patent: Mar. 1, 2022

(54) DISPLAY DEVICE

(71) Applicant: Samsung Display Co., Ltd., Yongin-Si (KR)

(72) Inventors: Sang Hun Park, Yongin-si (KR); Soo Won Kim, Yongin-si (KR); Il Ho Lee, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/905,975

(22) Filed: Jun. 19, 2020

(65) Prior Publication Data

US 2021/0132719 A1 May 6, 2021

(30) Foreign Application Priority Data

Nov. 4, 2019 (KR) .......................... 10-2019-0139715

(51) Int. Cl.
*G06F 3/041* (2006.01)
*H01L 27/32* (2006.01)
(Continued)

(52) U.S. Cl.
CPC .......... *G06F 3/0412* (2013.01); *G06F 3/0448* (2019.05); *G09G 3/3266* (2013.01); *G09G 3/3275* (2013.01); *H01L 27/323* (2013.01); *H01L 27/3244* (2013.01); *H01L 51/5237* (2013.01); *G06F 2203/04112* (2013.01)

(58) Field of Classification Search
CPC .... G06F 3/0412; G06F 3/0448; G06F 3/3266; G06F 3/3275; H01L 27/323; H01L 27/3244; H01L 51/5237

USPC .................... 345/173, 175; 358/1.15; 463/31; 331/39

See application file for complete search history.

(56) References Cited

U.S. PATENT DOCUMENTS 3,838,355 A * 9/1974 Papaieck ................ H03B 21/04
331/39
2003/0092488 A1 * 5/2003 Cheng ..................... A63F 13/23
463/31

(Continued)

FOREIGN PATENT DOCUMENTS

JP          07092928 A  *  4/1995  ............... G09G 1/16
KR     10-2005-0000026 A     1/2005
KR     10-2005-0062676 A     6/2005

*Primary Examiner* — Prabodh M Dharia
(74) *Attorney, Agent, or Firm* — Innovation Counsel LLP

(57) ABSTRACT

A display device includes a display including a plurality of pixels and an input sensor for sensing an input of a user. The display device includes: a driving controller for providing the display with a scan signal and a data signal according to a driving frequency; an input controller for providing a touch driving signal to the input sensor; a horizontal synchronization signal information line connecting the driving controller and the input controller, the horizontal synchronization signal information line transmitting a horizontal synchronization signal therethrough; and a vertical synchronization signal information line connecting the driving controller and the input controller, the vertical synchronization signal information line transmitting a vertical synchronization signal therethrough. Amplitude of the vertical synchronization signal or the horizontal synchronization signal varies according to the driving frequency.

21 Claims, 11 Drawing Sheets

(51) Int. Cl.
　　　*G09G 3/3266*　　(2016.01)
　　　*H01L 51/52*　　(2006.01)
　　　*G06F 3/044*　　(2006.01)
　　　*G09G 3/3275*　　(2016.01)

(56) References Cited

U.S. PATENT DOCUMENTS

| | | | |
|---|---|---|---|
| 2010/0027061 A1* | 2/2010 | Nakazawa | H04N 5/3765 358/1.15 |
| 2011/0285697 A1* | 11/2011 | Lee | G06F 1/324 345/419 |
| 2015/0097808 A1* | 4/2015 | Roh | G06F 3/0445 345/174 |
| 2015/0302831 A1* | 10/2015 | Reynolds | G09G 5/18 345/174 |
| 2016/0170540 A1* | 6/2016 | Yang | G02B 1/14 345/173 |
| 2017/0192591 A1* | 7/2017 | Jang | G06F 3/0383 |
| 2019/0243472 A1* | 8/2019 | Stafford | G02B 27/017 |
| 2019/0258108 A1* | 8/2019 | Xie | G06F 3/0446 |
| 2019/0373687 A1* | 12/2019 | Williams | A61N 5/06 |
| 2020/0393949 A1* | 12/2020 | Kim | G06F 3/04166 |

\* cited by examiner

DISPLAY DEVICE

CROSS-REFERENCE TO RELATED APPLICATION

The present application claims priority under 35 U.S.C. § 119(a) to Korean patent application No. 10-2019-0139715 filed on Nov. 4, 2019 in the Korean Intellectual Property Office, the entire disclosure of which is incorporated herein by reference.

BACKGROUND

1. Technical Field

The present disclosure generally relates to a display device, and more particularly, to a display device including an input sensor.

2. Related Art

As the information society is developed, requirements of a display device including an input sensor to display an image are increasing in various forms. Recently, various display devices such as a liquid crystal display device, a plasma display device, and an organic light emitting display device have been used.

An input sensor recognizes whether a touch occurs or calculates a touch coordinate by sequentially sensing a plurality of touch sensing electrodes for the purpose of touch sensing and collating the sensed results.

However, signals for driving a display device are coupled to signals for touch sensing, and therefore may act as noise against the input sensor.

Recently, the display device has been driven at a frequency changed for each period or region depending on the kind of an image displayed therein so as to reduce power consumption. Research for reducing the above-described noise, corresponding to a change in frequency of signals for driving the display device, has been conducted.

SUMMARY

Embodiments provide a display device including an input sensor, which is driven at several frequencies and reduces influence of noise on the input sensor.

In accordance with an aspect of the present disclosure, there is provided a display device including a display including a plurality of pixels and an input sensor for sensing an input of a user, the display device including: a driving controller configured to provide the display with a scan signal and a data signal according to a driving frequency; an input controller configured to provide a touch driving signal to the input sensor; a horizontal synchronization signal information line connecting the driving controller and the input controller, the horizontal synchronization signal information line transmitting a horizontal synchronization signal therethrough; and a vertical synchronization signal information line connecting the driving controller and the input controller, the vertical synchronization signal information line transmitting a vertical synchronization signal therethrough, wherein amplitude of the vertical synchronization signal or the horizontal synchronization signal varies according to the driving frequency.

A period in which the touch driving signal is provided may not overlap with a period in which a pulse of the horizontal synchronization signal is provided and a period in which the vertical synchronization signal is provided.

A period in which the touch driving signal is provided may not overlap with a period in which the scan signal is provided and a period in which the data signal is provided.

The driving frequency may have a plurality of driving frequencies. The amplitude of the vertical synchronization signal or the horizontal synchronization signal which varies according to the driving frequency may have a predetermined value.

The driving frequency may vary in a range of 1 Hz to 120 Hz.

The driving controller may include a vertical synchronization signal voltage regulator which alters the amplitude of the vertical synchronization signal, the vertical synchronization signal voltage regulator being electrically connected to one end portion of the vertical synchronization signal information line.

The vertical synchronization signal voltage regulator may include a plurality of resistors connected in series and a plurality of switching elements electrically connected between the one end portion of the vertical synchronization signal information line and nodes disposed between adjacent resistors, respectively.

The input sensor may include a touch driving electrode to which the touch driving signal is provided and a touch sensing electrode to which a touch sensing signal is received. The touch driving electrode and the touch sensing electrode may intersect each other while being insulated from each other.

An initialization voltage signal for allowing the touch driving electrode to be initialized to a predetermined voltage level may be provided before the touch driving signal is provided to the touch driving electrode and before the provision of the touch driving signal is ended.

The touch driving electrode and the touch sensing electrode may be disposed in the same layer.

Any one of the touch driving electrode and the touch sensing electrode may be electrically connected to the other of the touch driving electrode and the touch sensing electrode through a bridge pattern disposed in another layer at a position at which the touch driving electrode and the touch sensing electrode intersect each other.

The amplitude of the vertical synchronization signal may have a first amplitude when the driving frequency is a first frequency and have a second amplitude which is less than the first amplitude when the driving frequency is a second frequency which is less than the first frequency.

Both the amplitudes of the vertical synchronization signal and the horizontal synchronization signal may vary.

The sum of the amplitude of the vertical synchronization signal and the amplitude of the horizontal synchronization signal may have a first amplitude when the driving frequency is a first frequency and have a second amplitude which is less than the first amplitude when the driving frequency is a second frequency which is less than the first frequency.

The display device may further include a frequency information line connecting the driving controller and the input controller, the frequency information line transmitting a binary signal therethrough. The frequency information line may transmit a signal of '0' when the driving frequency is a first frequency, and transmit a signal of '1' when the driving frequency is a second frequency different from the first frequency.

In accordance with another aspect of the present disclosure, there is provided a display device including: a base substrate; a display panel including a TFT circuit layer disposed on the base substrate, the TFT circuit layer including a plurality of transistors; a light emitting device layer disposed on the TFT circuit layer, the light emitting device layer including a light emitting diode electrically connected to at least some of the plurality of transistors, and an encapsulation layer disposed on the light emitting device layer; and an input sensing layer including a first touch conductive layer, a first touch insulating layer and a second touch conductive layer which are sequentially stacked on the encapsulation layer; and a window substrate disposed on the input sensing layer, wherein a period in which a touch driving signal is provided to the input sensing layer does not overlap with a period in which a pulse of the horizontal synchronization signal or a pulse of the vertical synchronization signal is provided to the display panel.

The voltage signal provided to the plurality of transistors may include a scan signal and a data signal.

The input sensing layer may include a touch driving electrode to which the touch driving signal is provided and a touch sensing electrode from which a touch sensing signal is received. The touch driving electrode and the touch sensing electrode may be disposed in the second touch conductive layer.

The touch driving electrode and the touch sensing electrode may be mesh-shaped patterns, and include an opaque conductive material.

The input sensing layer may be patterned directly on the encapsulation layer to form an on-cell type input sensing layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
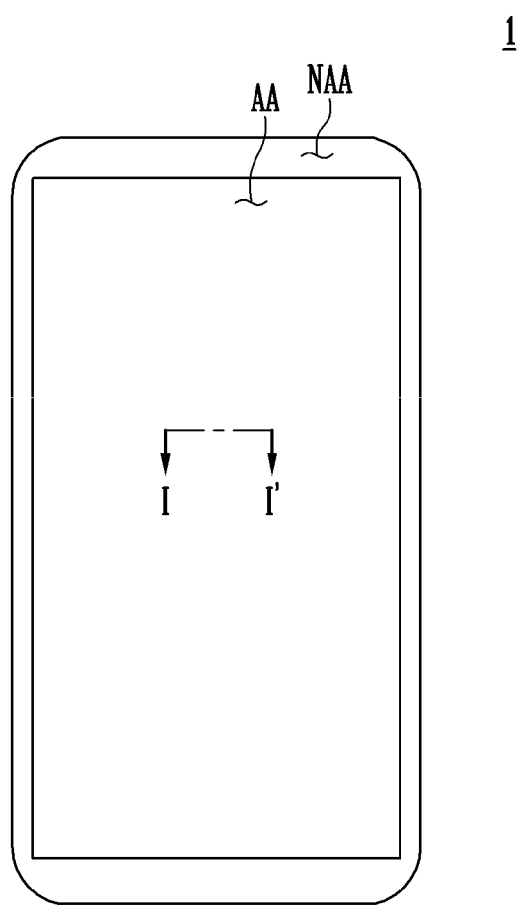
FIG. 1 is a plan view of a display device in accordance with an embodiment of the present disclosure.

The effects and characteristics of the present disclosure and a method of achieving the effects and characteristics will be clear by referring to the embodiments described below in detail together with the accompanying drawings. However, the present disclosure is not limited to the embodiments disclosed herein but may be implemented in various forms. The embodiments are provided by way of example only so that a person of ordinary skilled in the art can fully understand the features in the present disclosure and the scope thereof. Therefore, the present disclosure can be defined by the scope of the appended claims.

The term "on" that is used to designate that an element or layer is on another element or layer includes both a case where an element or layer is located directly on another element or layer, and a case where an element or layer is located on another element or layer via still another element layer. In the entire description of the present disclosure, the same drawing reference numerals are used for the same elements across various figures.

Although the terms "first," "second," and the like are used for describing various components, these components are not confined by these terms. These terms are merely used for distinguishing one component from the other components. Therefore, a first component may be a second component or vice versa according to the technical concepts of the present disclosure.

In this specification, a display device is a device for displaying a moving image or still image or a device for displaying a stereoscopic image, and may be used as a display screen for not only potable electronic devices such as a mobile terminal, a smart phone, a tablet computer, a smart watch, and a navigation system but also various products such as a television, a notebook computer, a monitor, an advertising board, and Internet of things.

Hereinafter, exemplary embodiments will be described with reference to the accompanying drawings. Throughout the drawings, the same reference numerals are given to the same elements.

Figure 2:
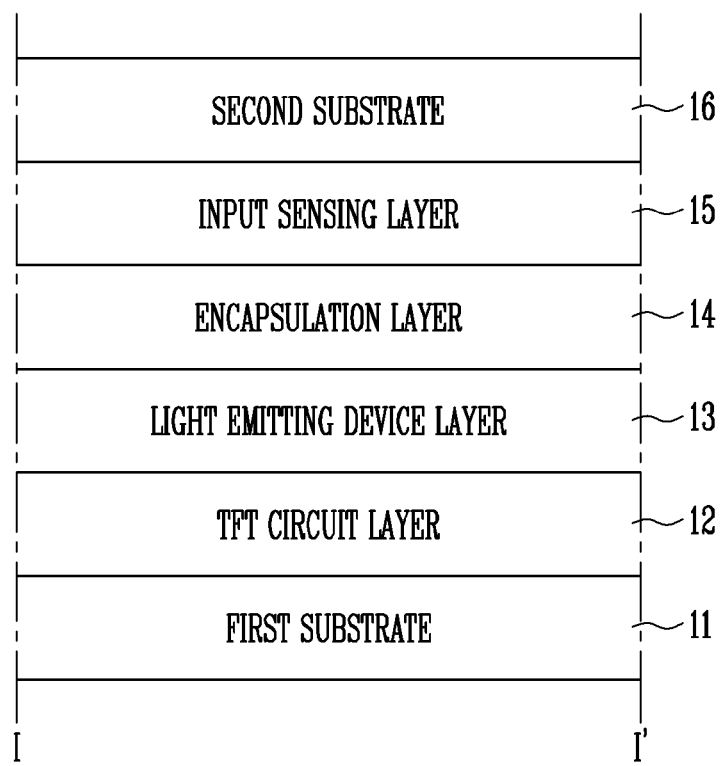
FIG. 2 is a schematic partial sectional view taken along line I-I' in the display device shown in FIG. 1.

FIG. 1 is a plan view of a display device in accordance with an embodiment of the present disclosure. FIG. 2 is a schematic partial sectional view taken along line I-I' in the display device shown in FIG. 1.

Referring to FIG. 1, the display device 1 may include an active region AA and a non-active region NAA.

The active region AA is defined as a region for displaying an image. Also, the active region AA may be used as a detection region for detecting an external environment. That is, the active region AA may be used as a region for displaying an image or recognizing an input of a user. The input of the user may include a touch input, fingerprint input, and the like. Hereinafter, the touch input will be described as an example. In an embodiment, the active region AA may have a flat shape. However, the present disclosure is not limited thereto, and at least a partial region of the active region AA may be bent.

The non-active region NAA is defined as a region disposed at the outside of the active region AA and any image is not displayed through the non-active region NAA. Although not separately shown in the drawing, in an embodiment, a speaker module, a camera module, a sensor module, and the like may be disposed in the non-active region NAA. In an embodiment, the sensor module may include at least one of an illuminance sensor, a proximity sensor, an infrared sensor, and an ultrasonic sensor. In an embodiment, like the active region AA, the non-active region NAA may have a flat shape. However, the present disclosure is not limited thereto, and at least a partial region of the non-active region NAA may be bent.

In an exemplary embodiment, the active region AA may have a rectangular shape longer in a lateral direction than in a longitudinal direction on the drawing. The lateral direction and the longitudinal direction are not limited to their terms but may be understood as relative directions intersecting each other. The non-active region NAA may be provided in a rectangular shape having round corners at the outside of the active region AA as described above. The shapes of the active region AA and the non-active region NAA may be defined relative to each other. The shapes of the active region AA and the non-active region NAA are not limited to the above-described shapes. For example, in another embodiment, the active region AA and the non-active region NAA may have various shapes such as an entirely square shape, other polygonal shapes, a circular shape, and an elliptical shape.

Referring to FIG. 2, the display device 1 may include a first substrate 11, a TFT circuit layer 12 disposed on the first substrate 11, a light emitting device layer 13 disposed on the TFT circuit layer 12, an encapsulation layer 14 disposed on the light emitting device layer 13, an input sensing layer 15 disposed on the encapsulation layer 14, and a second substrate 16 disposed on the input sensing layer 15. The stacked structure of the display device 1, which is shown in FIG. 2, is merely illustrative. Each layer may have a multi- or single-layered structure. If necessary, another layer may be further added, or some layers may be omitted.

An arrangement structure of the input sensing layer 15 and the stacked structure of the display device 1 will be described with reference to FIGS. 3 and 4.

Figure 3:
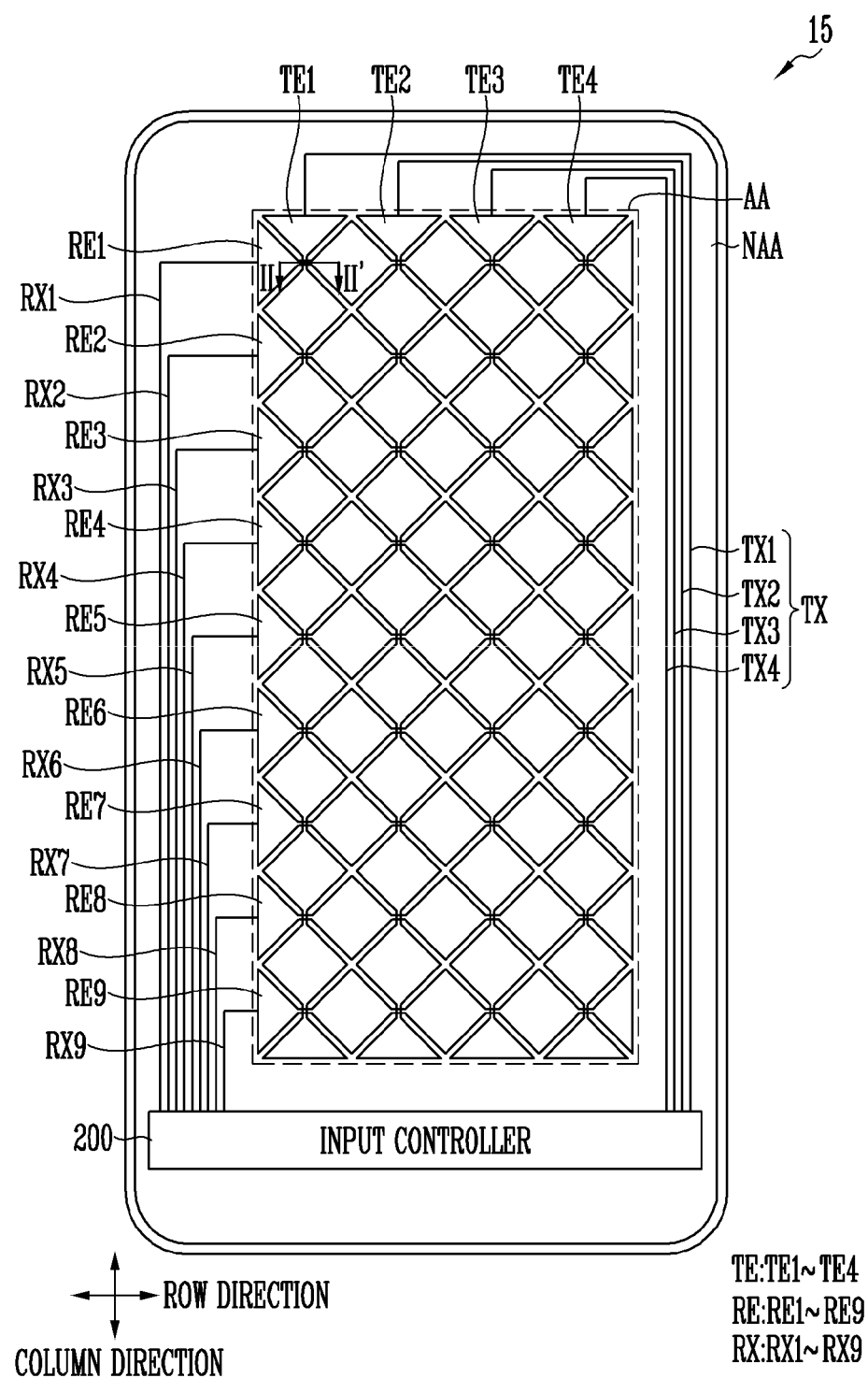
FIG. 3 is a layout view schematically illustrating each member of an input sensing layer in the display device in accordance with an embodiment of the present disclosure.

FIG. 3 is a layout view schematically illustrating each member of the input sensing layer in the display device in accordance with an embodiment of the present disclosure. FIG. 4 is a sectional view of a portion corresponding to line II-II' shown in FIG. 3 in the display device in accordance with an embodiment of the present disclosure. In FIGS. 3 and 4, for convenience of description, an input controller 200 is illustrated as a block, and a width of the non-active region NAA or a ratio of the non-active region NAA to the active region AA is slightly exaggerated. In addition, a description of the input controller 200 will be made in detail with reference to drawings from FIG. 6.

Figure 4:
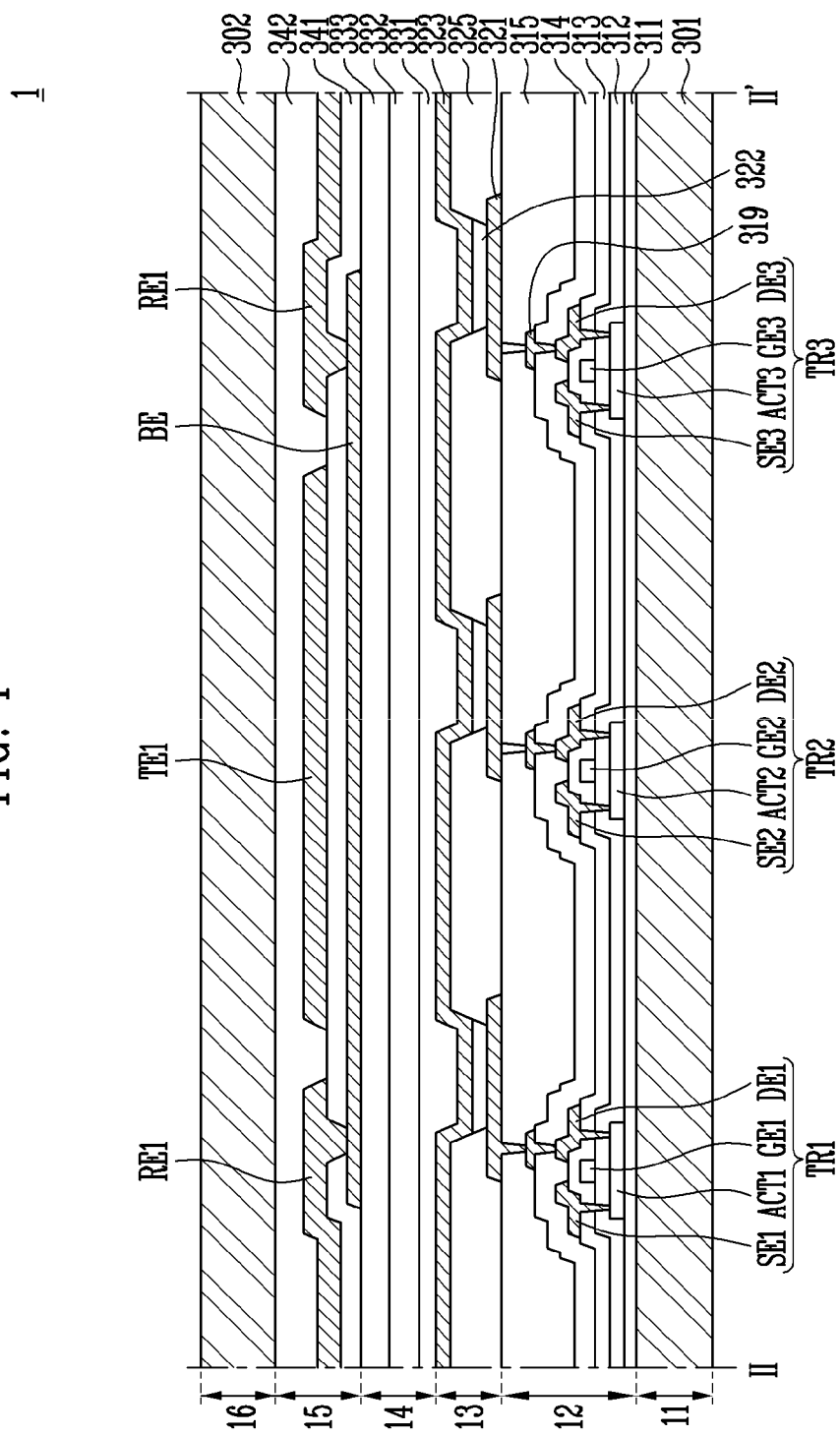
FIG. 4 is a sectional view of a portion corresponding to line II-II' shown in FIG. 3 in the display device in accordance with an embodiment of the present disclosure.

Referring to FIGS. 3 and 4, the display device 1 includes at least one base substrate 301. The display device 1 may further include a window substrate 302 disposed to face the base substrate 301. However, the present disclosure is not limited thereto, and the window substrate 302 may be omitted or be replaced with another structure such as a film or layer.

The base substrate 301 may be a flexible substrate. For example, the base substrate 301 may be one of a film substrate and a plastic substrate, which include a polymer organic material. For example, the base substrate 301 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. Also, the base substrate 301 may include a fiber reinforced plastic (FRP). However, the present disclosure is not limited thereto, and the base substrate 301 may be a rigid substrate. The base substrate 301 may be one of a glass substrate, a quartz substrate, a glass ceramic substrate, and a crystalline glass substrate.

A plurality of light emitting devices, sensing electrodes, and signal lines connected thereto may be disposed on the base substrate 301. The active region AA and the non-active region NAA may be distinguished each other by existence of the plurality of light emitting devices on the base substrate 301. For example, the plurality of light emitting devices and the sensing electrodes are disposed on the base substrate 301 in the active region AA and the signal lines are disposed on the base substrate 301 in the non-active region NAA The base substrate 301 may correspond to the first substrate 11 shown in FIG. 2.

A buffer layer 311 is disposed on the base substrate 301. The buffer layer 311 functions to planarized a surface of the base substrate 301 and to prevent penetration of moisture or external air into the display device 1, for example, into the TFT circuit layer 12 and/or the light emitting layer 13. The buffer layer 311 may be an inorganic insulating layer. The buffer layer 311 may be a single layer or a multi-layer.

A plurality of transistors TR1, TR2, and TR3 are disposed on the buffer layer 311. The plurality of transistors TR1, TR2, and TR3 may be driving transistors. At least one of the transistors TR1, TR2, and TR3 may be provided for each pixel. The transistors TR1, TR2, and TR3 may be provided in the form of thin film transistors. The transistors TR1, TR2, and TR3 may include semiconductor layers ACT1, ACT2, and ACT3, gate electrodes GE1, GE2, and GE3, source electrodes SE1, SE2, and SE3, and drain electrodes DE1, DE2, and DE3, respectively.

In detail, the semiconductor layers ACT1, ACT2, and ACT3 are disposed on the buffer layer 311. The semiconductor layers ACT1, ACT2, and ACT3 may include amorphous silicon, poly-silicon, or an organic semiconductor. In another embodiment, the semiconductor layers ACT1, ACT2, and ACT3 may include an oxide semiconductor. Although not shown in the drawings, each of the semiconductor layers ACT1, ACT2, and ACT3 may include a channel region, and a source region and a drain region which are disposed at both sides of the channel region and are doped with an impurity.

A first conductive layer which includes the gate electrodes GE1, GE2, and GE3 is disposed on a gate insulating layer 312. The gate electrodes GE1, GE2, and GE3 may be formed of a metallic material having conductivity. For example, the gate electrodes GE1, GE2, and GE3 may include molybdenum (Mo), aluminum (Al), copper (Cu), and/or titanium (Ti). Each of the gate electrodes GE1, GE2, and GE3 may be a single layer or a multi-layer.

A first interlayer insulating layer 313 is disposed on the first conductive layer. The first interlayer insulating layer 313 may be an inorganic layer. The first interlayer insulating layer 313 may be a single layer or a multi-layer.

A second conductive layer is disposed on the first interlayer insulating layer 313. The second conductive layer may include the source electrodes SE1, SE2, and SE3 and the drain electrodes DE1, DE2, and DE3. The source electrodes SE1, SE2, and SE3 and the drain electrodes DE1, DE2, and DE3 are formed of a metallic material having conductivity.

The source electrodes SE1, SE2, and SE3 and the drain electrodes DE1, DE2, and DE3 may be electrically connected to the source regions and the drain regions of the semiconductor layers ACT1, ACT2, and ACT3 through contact holes penetrating the interlayer insulating layer 313 and the gate insulating layer 312, respectively.

Although not shown in the drawings, the display device 1 may further include a storage capacitor and a switching transistor disposed on the buffer layer 311.

A second interlayer insulating layer 314 is disposed on the second conductive layer. The second interlayer insulating layer 314 may be an inorganic layer. The second interlayer insulating layer 314 may be a single layer or a multi-layer.

A third conductive layer is disposed on the second interlayer insulating layer 314. The third conductive layer may include a connection electrode 319 connecting the second conductive layer and a first pixel electrode 321 which will be described later. The connection electrode 319 may be electrically connected to each of the drain electrodes DE1, DE2, and DE3 (or the source electrodes SE1, SE2, and SE3) through a via hole penetrating the second interlayer insulating layer 314. The third conductive layer may be formed of the same material as the second conductive layer, or be formed of one of the materials listed in the second conductive layer or a combination thereof.

In another embodiment, the third conductive layer 319 and the second interlayer insulating layer 314 may be omitted. In this case, the second conductive layer and the first pixel electrode 321 may be electrically connected directly to each other.

A protective layer 315 is disposed on the third conductive layer. The protective layer 315 is disposed to cover a pixel circuit including the transistors TR1, TR2, and TR3. The protective layer 315 may be a passivation layer or a planarization layer. The passivation layer may include $SiO_2$, $SiN_x$, and the like, and the planarization layer may include a material such as acryl or polyimide. The protective layer 315 may include both the passivation layer and the planarization layer. The passivation layer may be disposed on the third conductive layer, and the planarization layer may be disposed on the passivation layer.

The buffer layer 311 to the protective layer 315 may correspond to the TFT circuit layer 12 shown in FIG. 2.

A plurality of first pixel electrodes 321 are disposed on the protective layer 315. The first pixel electrode 321 may be an anode electrode of a light emitting diode disposed in each pixel. The light emitting diode may include an organic light emitting diode, a quantum dot light emitting diode, etc. Hereinafter, the organic light emitting diode will be described as an example.

The first pixel electrode 321 may be electrically connected to the connection electrode 319 through a via hole penetrating the protective layer 315. That is, the first pixel electrode 321 may be electrically connected to each of the drain electrodes DE1, DE2, and DE3 (or the source electrode SE1, SE2, SE3) of the transistors TR1, TR2, and TR3.

The first pixel electrode 321 may include a material having a high work function. The first pixel electrode 321 may include Indium Tin Oxide (TIO), Indium Zinc Oxide (IZO), Zinc Oxide (ZnO), Indium Oxide ($In_2O_3$), or the like. The exemplified conductive materials have a transparent characteristic while having a relatively high work function. When the display device 1 is a top-emission display device, the first pixel electrode may further include a reflective material, e.g., silver (Ag), magnesium (Mg), aluminum (Al), platinum (Pt), palladium (Pd), gold (Au), nickel (Ni), neodymium (Nd), iridium (Jr), chromium (Cr), lithium (Li), calcium (Ca) or any mixture thereof, in addition to the exemplified conductive materials. Therefore, the first pixel electrode 321 may have a single-layered structure made of the exemplified conductive material or the exemplified reflective materials, or have a multi-layered structure in which the exemplified conductive and reflective materials are stacked.

A pixel defining layer 325 is disposed over the first pixel electrode 321. The pixel defining layer 325 includes an opening exposing at least a portion of the first pixel electrode 321, for example, at least a center portion of the pixel electrode 321. The pixel defining layer 325 may include an organic material or an inorganic material. In an embodiment, the pixel defining layer 325 may be formed of a material including photoresist, polyimide-based resin, acryl-based resin, silicon compound, or the like.

An organic emitting layer 322 is disposed on the first pixel electrode 321 exposed by the pixel defining layer 325.

A second pixel electrode 323 is disposed on the organic emitting layer 322. The second pixel electrode 323 may be a common electrode CE disposed throughout the display device 1, for example, at least, throughout the active region. Also, the second pixel electrode 323 may be a cathode electrode of the organic light emitting diode.

The second pixel electrode 323 may include a material having a low work function. The second pixel electrode 323 may include Li, Ca, LiF/Ca, LiF/Al, Al, Mg, Ag, Pt, Pd, Ni, Au, Nd, Jr, Cr, BaF, Ba, or any compound or mixture (e.g., a mixture of Ag and Mg) thereof. The second pixel electrode 323 may further include an auxiliary electrode. The auxiliary electrode may include a layer formed by depositing the low work function material, and a transparent metal oxide, e.g., Indium Tin Oxide (ITO), Iridium Zinc Oxide (IZO), Zinc Oxide (ZnO), Indium Tin Zinc Oxide (ITZO), or the like on the low work function material.

When the display device 1 is a top-emission display device, a conductive layer having a low work function as the second pixel electrode 323 may be formed as a thin film, and a transparent conductive layer, e.g., an Indium Tin Oxide (ITO) layer, an Iridium Zinc Oxide (IZO) layer, a Zinc Oxide (ZnO) layer, an Indium Oxide ($In_2O_3$) layer, or the like may be stacked on the conductive layer.

The first pixel electrode 321, the organic emitting layer 322, and the second pixel electrode 323, which are described above, may constitute an organic light emitting diode.

The first pixel electrode 321 to the second pixel electrode 323 may correspond to the light emitting device layer 13 shown in FIG. 2.

An encapsulation layer 331, 332, and 333 is disposed over the second pixel electrode 323. The encapsulation layer may include a first inorganic layer 331, an organic layer 332, and a second inorganic layer 333 sequentially disposed on the second pixel electrode 323. The first inorganic layer 331 and the second inorganic layer 333 may include at least one selected from the group consisting of silicon oxide ($SiO_x$), silicon nitride ($SiN_x$), and silicon oxynitride ($SiON_x$), and the organic layer 332 may include any one selected from the group consisting of epoxy, acrylate, and urethaneacrylate.

The above-described encapsulation layer 331, 332, and 333 may correspond to the encapsulation layer 14 shown in FIG. 2.

The input sensing layer 15 is disposed on the encapsulation layer 331, 332, and 333. The input sensing layer 15 may include an input sensor for sensing a touch input of a user. Hereinafter, the input sensor will be described in detail.

The input sensor may include a plurality of touch sensing electrode TE and RE. The plurality of touch sensing electrode TE and RE may sense a touch, hovering, a gesture, proximity of a user, etc. The touch sensing electrodes TE and RE may be configured in different shapes according to various types such as a resistive type, a capacitive type, an electro-magnetic (EM) type, and an optical type. For example, when the touch sensing electrodes TE and RE are configured as capacitive type touch sensing electrodes, the touch sensing electrodes TE and RE may be configured as self-capacitive type touch sensing electrodes, mutual-capacitive type touch sensing electrodes, or the like.

The plurality of touch sensing electrodes TE and RE may include a transparent conductive material such as Indium Tin Oxide (ITO), Indium Zinc Oxide (IZO), Zinc Oxide (ZnO) or Indium Tin Zinc Oxide (ITZO), or include at least one opaque conductive material selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The input sensor includes a plurality of first touch sensing electrodes RE, a plurality of second touch sensing electrodes TE, and a plurality of touch lines RX and TX connected to the plurality of first touch sensing electrodes RE and the plurality of second touch sensing electrodes TE, respectively. The input sensor may be patterned directly on the encapsulation layer 331, 332, and 333 to form an on-cell type input sensor.

The first touch sensing electrode RE may be any one of a touch sensing electrode and a touch driving electrode, and the second touch sensing electrode TE may be the other of the touch sensing electrode and the touch driving electrode. In this embodiment, a case where the first touch sensing electrode RE is the touch sensing electrode and the second touch sensing electrode TE is the touch driving electrode is described as an example.

Although a case where the plurality of first touch sensing electrodes RE include nine touch sensing electrodes RE1 to RE9 and the plurality of second touch sensing electrodes TE include four touch driving electrodes TE1 to TE4 is illustrated in FIG. 3, numbers of the first touch sensing electrodes RE and the second touch sensing electrodes TE are not limited to those illustrated in FIG. 3.

The first touch sensing electrode RE may extend in a row direction, and the second touch sensing electrode TE may extend in a column direction intersecting the row direction. The row direction and the column direction are not limited to their terms but may be understood as relative directions intersecting each other.

In an embodiment, a length of the second touch sensing electrode TE in the column direction may be longer than that of the first touch sensing electrode RE in the row direction in general. The display device 1 may have a shape longer in the column direction than in the row direction. The plurality of first touch sensing electrodes RE may be arranged in the column direction, and the plurality of second touch sensing electrode TE may be arranged in the row direction. In an embodiment, the first touch sensing electrodes RE and the second touch sensing electrodes TE may be provided in a form in which diamond-patterned electrodes are connected.

The first touch sensing electrode RE and the second touch sensing electrode TE may be formed on the same layer. The first touch sensing electrode RE and the second touch sensing electrode TE may be insulated from each other at a portion at which the first touch sensing electrode RE and the second touch sensing electrode TE intersect each other. In order to prevent a short circuit of the first touch sensing electrode RE and the second touch sensing electrode TE, which are disposed in the same layer, one of the first touch sensing electrode RE and the second touch sensing electrode TE may be connected using a bridge pattern BE which is form of a conductive material different from the material forming the first touch sensing electrode RE and the second touch sensing electrode TE.

When the second touch sensing electrodes TE receive a detection signal (or transmission signal) for detecting an external input, the first touch sensing electrode RE may be capacitively coupled to the second touch sensing electrodes TE. When an input means is disposed on a specific second touch sensing electrode TE among the capacitively coupled second touch sensing electrodes TE, a capacitance between the first touch sensing electrode RE and the second touch sensing electrode TE may be changed. The input sensor may calculate coordinate information of the input means by detecting the changed capacitance from the specific second touch sensing electrode TE.

The first touch sensing electrodes RE may be electrically connected to the input controller 200 by first touch lines RX and the second touch sensing electrodes TE may be electrically connected to the input controller 200 by second touch lines TX. The input controller 200 may transmit a touch driving signal having a predetermined voltage level to the second touch sensing electrodes TE and receive a touch sensing signal from the first touch sensing electrode RE, and calculate coordinate information of the input means by detecting a changed capacitance.

The input sensing layer 15 may include a first touch conductive layer, a first touch insulating layer 341 disposed on the first touch conductive layer, a second touch conductive layer disposed on the first touch insulating layer 341, and a second touch insulating layer 342 disposed on the second touch conductive layer.

In an embodiment, the first touch conductive layer may be disposed directly on the encapsulation layer 331, 332, and 333, but the present disclosure is not limited thereto. In another embodiment, a base may be included between the encapsulation layer 331, 332, and 333 and the first touch conductive layer. The base may be made of plastic such as polyethylene terephthalate (PET), polyimide (PI), polycarbonate (PC), polyethylene (PE), polypropylene (PP), polysulfone (PSF), polymethylmethacrylate (PMMA), triacetylcellulose (TAC), or cycloolefin polymer (COP).

In an embodiment, the above-described bridge pattern BE may be formed of the same material and may be disposed on the same layer as the first touch conductive layer. The first touch conductive layer may include the transparent conductive material or the opaque conductive material, which is described above.

The first touch insulating layer 341 may include a silicon compound, a metal oxide, and the like. The first touch insulating layer 341 may include contact holes exposing portions of the first touch conductive layer.

The second touch conductive layer may include the first touch sensing electrodes RE and the second touch sensing electrodes TE. Each of the first touch sensing electrodes RE may be electrically connected to the bridge pattern BE through the contact holes penetrating the first touch insulating layer 341.

The second touch insulating layer 342 may include the same material as the first touch insulating layer 341. In another embodiment, the second touch insulating layer 342 may be omitted.

In an embodiment, the plurality of touch lines TX and RX may be formed at the same time with the first touch conductive layer or the second touch conductive layer. In another embodiment, the plurality of touch lines TX and RX may have a dual line structure in which the plurality of touch lines TX and RX include both the first touch conductive layer and the second touch conductive layer.

The input sensor may sense a touch input of a user in the active region AA.

The first touch to the second touch insulating layer 342 may correspond to the input sensing layer 15 shown in FIG. 15. That is, the input sensing layer 15 shown in FIG. 2 may be patterned directly on the encapsulation layer 14 shown in FIG. 2 to form an on-cell type input sensing layer.

The window substrate 302 may be disposed on the input sensing layer 15. The window substrate 302 may include a transparent substrate including glass, plastic, and the like. The window substrate 302 may be a sealing substrate or a protective substrate.

The window substrate 302 may correspond to the second substrate 16 shown in FIG. 2.

Although not shown in the drawings, an adhesive layer may be included between the input sensing layer 15 and the window substrate 302. The adhesive layer is interposed between the input sensing layer 15 and the second substrate 16 to couple the input sensing layer 15 and the second substrate 16 to each other. In an example, the adhesive layer may include a film having adhesion, e.g., an Optically Clear Adhesive (OCA). In another example, the adhesive layer may include an Optically Clear Resin (OCR).

Figure 5:
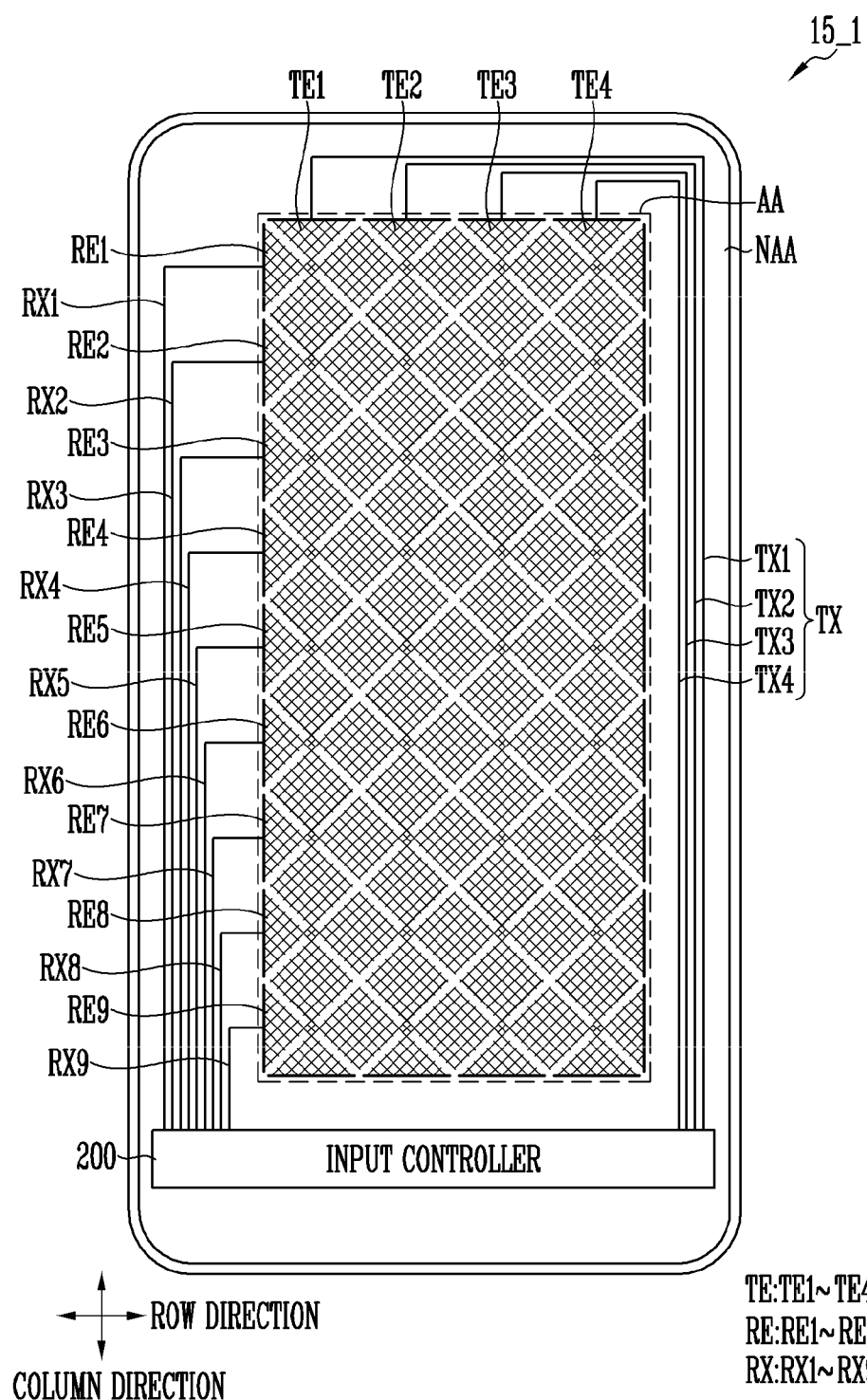
FIG. 5 is a layout view schematically illustrating a portion of the input sensing layer as a modification of the input sensing layer shown in FIG. 3.

FIG. 5 is a layout view schematically illustrating a portion of the input sensing layer as a modification of the input sensing layer shown in FIG. 3.

Referring to FIG. 5, first touch sensing electrodes RE and second touch sensing electrode TE in an input sensing layer 15_1 may be mesh patterns. The mesh pattern may overlap with the pixel defining layer 325. In some embodiments, the mesh pattern may not overlap with the first pixel electrode 321.

The mesh pattern may include at least one opaque conductive material selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu).

Hereinafter, a correlation between a member directly related to display of an image and a member related to an external input from a user will be described. The member directly related to the display of the image may be disposed in the TFT circuit layer 12 and the light emitting device layer 13, and the member related to the external input from the user may be disposed in the input sensing layer 15.

Figure 6:
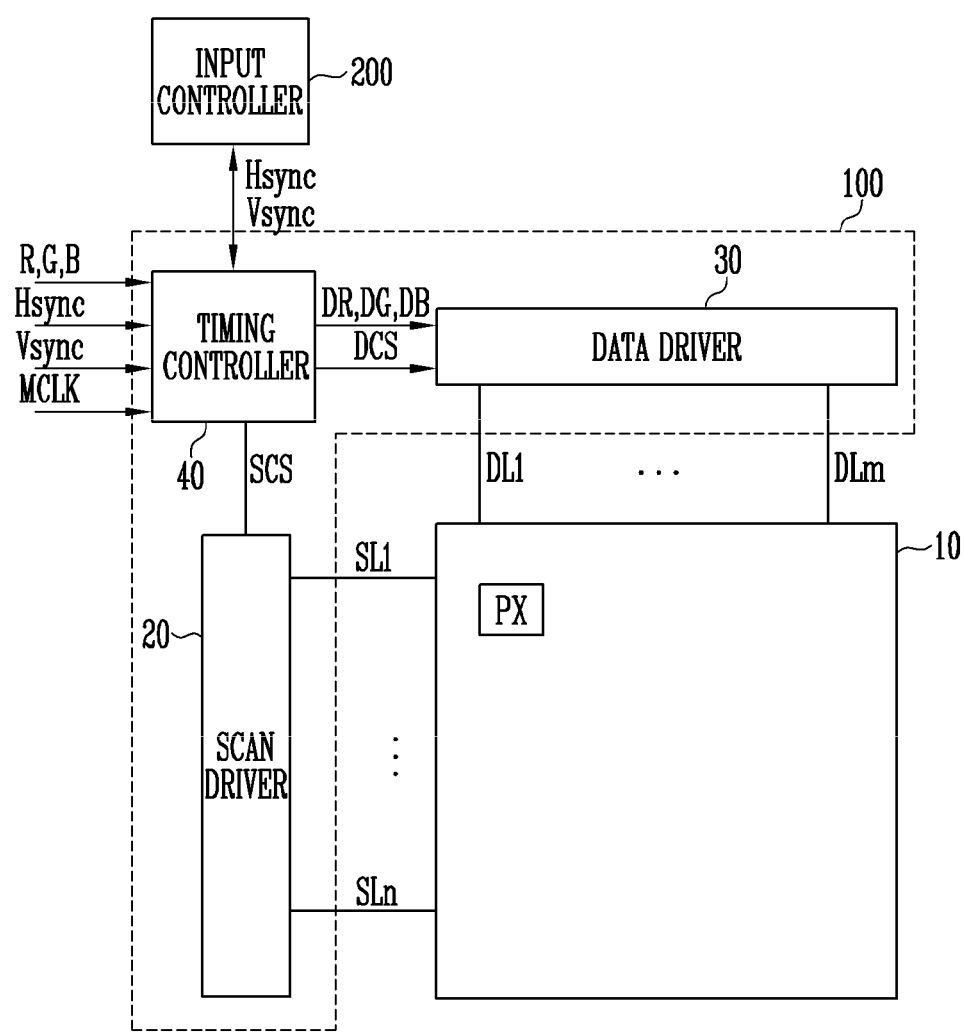
FIG. 6 is a schematic block diagram of a display device in accordance with the embodiment of the present disclosure.
Figure 7:
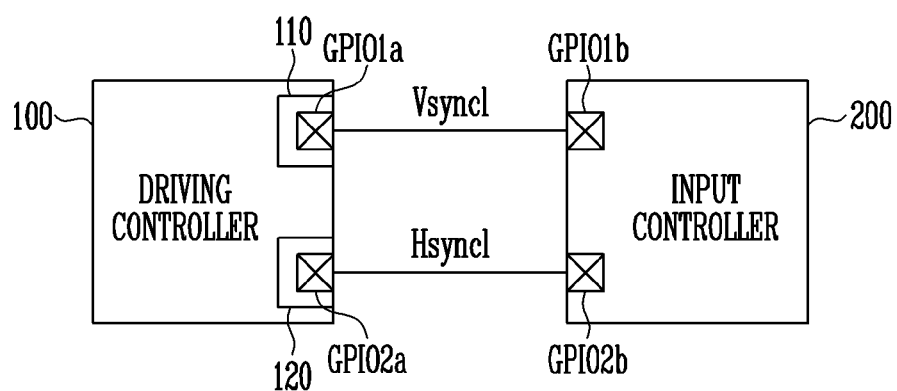
FIG. 7 is a block diagram illustrating a relationship between a driving controller and an input controller, which are shown in FIG. 6.
Figure 8:
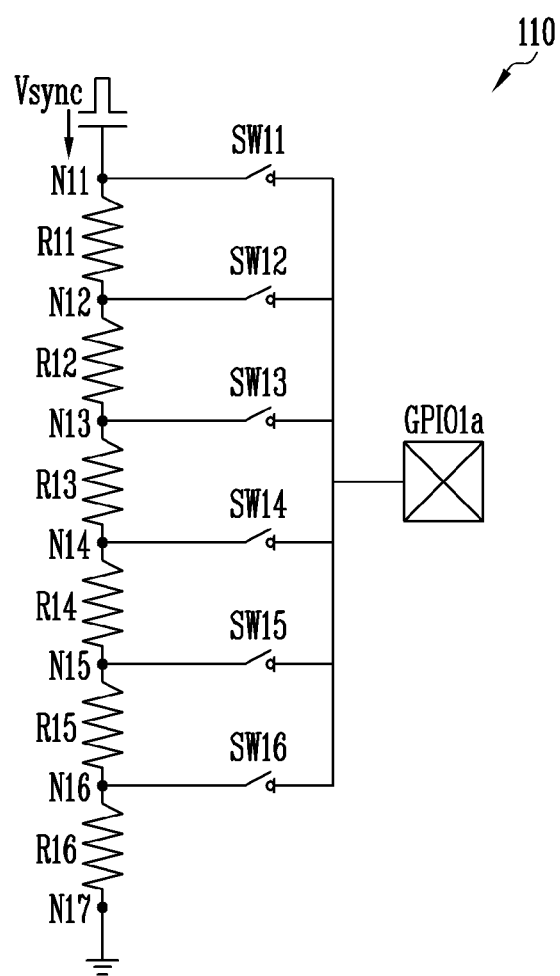
FIG. 8 is a circuit diagram illustrating a concept of a vertical synchronization signal voltage regulator in the driving controller shown in FIG. 7.

FIG. 6 is a schematic block diagram of a display device in accordance with the embodiment of the present disclosure. FIG. 7 is a block diagram illustrating a relationship between a driving controller and an input controller, which are shown in FIG. 6. FIG. 8 is a circuit diagram illustrating a concept of a vertical synchronization signal voltage regulator in the driving controller shown in FIG. 7.

Referring to FIG. 6, the display device includes a display panel 10 including a plurality of pixels PX, a scan driver 20, a data driver 30, a timing controller 40, and an input controller 200.

The display panel 10 includes the plurality of pixels PX located at intersection portions of a plurality of scan lines SL1 to SLn and a plurality of data lines DL1 to DLm, to be arranged in a matrix form. Here, m and n are natural numbers. The plurality of pixels PX emit lights, thereby displaying an image in an active region AA.

The plurality of scan lines SL1 to SLn may extend in a row direction, and the plurality of data lines DL1 to DLm may extend in a column direction. The row direction and the column direction may be reversed.

The scan driver 20 generates and transfers a scan signal to each pixel PX through a corresponding scan line among the plurality of scan lines SL1 to SLn.

The data driver 30 transfers a data signal to each pixel PX through a corresponding data line among the plurality of data lines DL1 to DLm. A data signal supplied to a pixel PX selected by a scan signal whenever the scan signal is supplied to a corresponding scan line among the plurality of scan lines SL1 to SLn.

The timing controller 40 converts a plurality of image signals R, G, and B transferred from the outside into a plurality of image data signals DR, DG, and DB, and transfers the plurality of image data signals DR, DG, and DB to the data driver 30. Also, the timing controller 40 receives a vertical synchronization signal Vsync, a horizontal synchronization signal Hsync, and a clock signal MCLK from the outside, to generate control signals for controlling driving of the scan driver 20 and the data driver 30 and to transfer the control signals respectively to the scan driver 20 and the data driver 30. The outside may be an application processor.

That is, the timing controller 40 may generate a scan driving control signal SCS for controlling the scan driver 20 and a data driving control signal DCS for controlling the data driver 30, and transfer the scan driving control signal SCS and the data driving control signal DCS respectively to the scan driver 20 and the data driver 30.

Although not shown in the drawing, each of the plurality of pixels PX is supplied with a first power voltage (not shown) and a second power voltage (not shown). The first power voltage may be a predetermined high level voltage, and the second power voltage may be a voltage lower than the first power voltage.

Each of the plurality of pixels PX emits light with a predetermined luminance according to a driving current flowing through a light emitting diode in response to a data signal transferred through a corresponding data line among the plurality of data lines DL1 to DLm.

The first power voltage, the second power voltage, and the like may be supplied from an external voltage source.

The scan driver 20, the data driver 30, and the timing controller 40 may be included in a driving controller 100 for controlling an operation of the display panel 10. The driving controller 100 may be, for example, a driver IC. At least some elements included in the display panel 10 may be electrically connected directly to the driver IC.

A driving frequency of the driving controller 100 may vary. In an embodiment, the driving frequency of the driving controller 100 may vary in a range of 1 Hz to 120 Hz. In an embodiment, the driving controller 100 may control the display panel 10 to be driven at three or more frequencies in the above-described range. For example, the display panel 10 may be selectively driven among 1 Hz, 15 Hz, 30 Hz, 60

Hz, 90 Hz, and 120 Hz, which are exemplary frequencies, according to the kind of an image or a position of the image.

The driving frequency may vary in several forms. In an example, the driving controller 100 may control the display panel 10 to be driven at 1 Hz in a partial region of an active region, control the display panel 10 to be driven at 60 Hz in another partial region of the active region, and control the display panel 10 to be driven at 120 Hz in the other region of the active region. In another example, the driving controller 100 may control the display panel 10 to be driven at 1 Hz during one period, control the display panel 10 to be driven at 60 Hz during another period, and control the display panel 10 to be driven at 120 Hz during the other period.

The driving controller 100 may control the display panel 10 to be driven at a variable frequency through regulation of the vertical synchronization signal Vsync and the horizontal synchronization signal Hsync in the timing controller 40.

The input controller 200 may receive the vertical synchronization signal Vsync and the horizontal synchronization signal Hsync from the driving controller 100, for example, from the timing controller 40, and provide a touch driving signal to an input sensor and receive a touch sensing signal from the input sensor. The input controller 200 may be, for example, a touch IC.

In an embodiment, the input controller 200 may provide the touch driving signal to the input sensor and receive the touch sensing signal from the input sensor when a scan signal and a data signal are not transmitted to the display panel 10.

When the input sensor is formed as an on-cell type input sensor, the scan signal and the data signal may act as noise against the touch driving signal and the touch sensing signal. Therefore, the input controller 200 may provide the touch driving signal and the touch sensing signal to the input sensor such that a period in which the touch driving signal and the touch sensing signal are provided to the input sensor does not overlap with that in which the scan signal and the data signal are transmitted to the display panel 10.

Referring to FIG. 7, the input controller 200 may receive the vertical synchronization signal Vsync and the horizontal synchronization signal Hsync from the driving controller 100, for example, from the timing controller 40, to determine a period in which the scan signal and the data signal are transmitted to the input sensor.

In an embodiment, the input controller 200 and the driving controller 100 may communicate with each other to exchange signals through a plurality of signal lines. The plurality of signal lines may include a vertical synchronization signal information line Vsync1 and a horizontal synchronization signal information line Hsync1. In an embodiment, the plurality of signal lines may be connected in a manner that input/output pins GPIO1 and GPIO2 disposed at both end portions thereof are respectively coupled to the input controller 200 and the driving controller 100. For example, an input pin GPIO1a of the vertical synchronization signal information line Vsync1 may be connected to the driving controller 100, and an output pin GPIO1b of the vertical synchronization signal information line Vsync1 may be connected to the input controller 200. In addition, an input pin GPIO2a of the horizontal synchronization signal information line Hsync1 may be connected to the driving controller 100, and an output pin GPIO2b of the horizontal synchronization signal information line Hsync1 may be connected to the input controller 200. Each of the vertical synchronization signal Vsync and the horizontal synchronization signal Hsync, which are provided from the driving controller 100 to the input controller 200, may be a pulse width modulation signal having a predetermined amplitude.

In an embodiment, the amplitude of the vertical synchronization signal Vsync supplied from the driving controller 100 to the input controller 200 may vary. Similarly, the amplitude of the horizontal synchronization signal Hsync supplied from the driving controller 100 to the input controller 200 may vary.

In an embodiment, the driving controller 100 may include a vertical synchronization signal voltage regulator 110 and a horizontal synchronization signal voltage regulator 120 to alter the amplitude of the vertical synchronization signal Vsync and the amplitude of the horizontal synchronization signal Hsync. The vertical synchronization signal voltage regulator 110 may be electrically connected to the input pin GPIO1a which is connected to the vertical synchronization signal information line Vsync1. The horizontal synchronization signal voltage regulator 120 may be electrically connected to the input pin GPIO2a which is connected to the horizontal synchronization signal information line Hsync1.

A circuit diagram of the vertical synchronization signal voltage regulator 110 and a method of regulating the amplitude of the vertical synchronization signal Vsync will be described with reference to FIG. 8. A circuit diagram of the horizontal synchronization signal voltage regulator 120 and a method of regulating the amplitude of the horizontal synchronization signal Hsync are substantially identical to the circuit diagram of the vertical synchronization signal voltage regulator 110 and the method of regulating the amplitude of the vertical synchronization signal Vsync, and therefore, overlapping descriptions will be omitted.

The vertical synchronization signal voltage regulator 110 may include a plurality of switching elements SW11 to SW16 and a plurality of resistors R11 to R16, which are used to vary the amplitude of the vertical synchronization signal Vsync. The amplitude of the vertical synchronization signal Vsync input to the vertical synchronization signal voltage regulator 110 may be regulated through at least some of the plurality of switching elements SW11 to SW16 and at least some of the plurality of resistors R11 to R16, and the regulated amplitude may be provided to the input pin GPIO1a which is connected to the vertical synchronization signal information line Vsync1.

In an embodiment, in the vertical synchronization signal voltage regulator 110, the plurality of resistors R11 to R16 having a specific resistance value may be connected in series, and the switching elements SW11 and SW16 may be connected between a node connecting adjacent resistors and the input pin GPIO1a of the vertical synchronization signal information line Vsync1, respectively. Each of the switching elements SW11 to SW16 may be provided in the form of a thin film transistor, but the present disclosure is not limited thereto.

For example, in the vertical synchronization signal voltage regulator 110, a first resistor R11 may be connected between a first node N11 and a second node N12, a second resistor R12 may be connected between a second node N12 and a third node N13, a third resistor R13 may be connected between the third node N13 and a fourth node N14, a fourth resistor R14 may be connected between the fourth node N14 and a fifth node N15, a fifth resistor R15 may be connected between the fifth node N15 and a sixth node N16, and a sixth resistor R16 may be connected between the sixth node N16 and a seventh node N17. The first node N11 may be a node electrically connected to an input terminal to which the vertical synchronization signal Vsync is input, and the seventh node N17 may be a node electrically connected to a ground.

A first switching element SW11 may be connected between the first node N11 and the input pin GPIO1$a$ of the vertical synchronization signal information line Vsync1, a second switching element SW12 may be connected between the second node N12 and the input pin GPIO1$a$ of the vertical synchronization signal information line Vsync1, a third switching element SW13 may be connected between the third node N13 and the input pin GPIO1$a$ of the vertical synchronization signal information line Vsync1, a fourth switching element SW14 may be connected between the fourth node N14 and the input pin GPIO1$a$ of the vertical synchronization signal information line Vsync1, a fifth switching element SW15 may be connected between the fifth node N15 and the input pin GPIO1$a$ of the vertical synchronization signal information line Vsync1, and a sixth switching element SW16 may be connected between the sixth node N16 and the input pin GPIO1$a$ of the vertical synchronization signal information line Vsync1.

In an embodiment, each amplitude of a vertical synchronization signal Vsync and/or a horizontal synchronization signal Hsync, corresponding to each driving frequency, may be regulated to have a predetermined amplitude. For example, each amplitude of the corresponding vertical synchronization signal Vsync and/or the corresponding horizontal synchronization signal Hsync may be set to become smaller as the driving frequency becomes smaller, but the present disclosure is not limited thereto.

In an exemplary embodiment, when the driving controller 100 controls the display to be driven at 120 Hz, the first switching element SW11 may be switched on, and the other switching elements SW12 to SW16 may be switched off. Accordingly, the amplitude of the vertical synchronization signal Vsync provided to the input pin GPIO1$a$ of the vertical synchronization signal information line Vsync1 may be regulated to become 1.8 V.

In addition, when the driving controller 100 controls the display to be driven at 90 Hz, the second switching element SW12 may be switched on, and the other switching elements SW11 and SW13 to SW16 may be switched off. Accordingly, the amplitude of the vertical synchronization signal Vsync provided to the input pin GPIO1$a$ of the vertical synchronization signal information line Vsync1 may be regulated to become 1.6 V.

In addition, when the driving controller 100 controls the display to be driven at 60 Hz, the third switching element SW13 may be switched on, and the other switching elements SW11, SW12, and SW14 to SW16 may be switched off. Accordingly, the amplitude of the vertical synchronization signal Vsync provided to the input pin GPIO1$a$ of the vertical synchronization signal information line Vsync1 may be regulated to become 1.4 V.

In addition, when the driving controller 100 controls the display to be driven at 30 Hz, the fourth switching element SW14 may be switched on, and the other switching elements SW11 to SW13, SW15, and SW16 may be switched off. Accordingly, the amplitude of the vertical synchronization signal Vsync provided to the input pin GPIO1$a$ of the vertical synchronization signal information line Vsync1 may be regulated to become 1.2 V.

In addition, when the driving controller 100 controls the display to be driven at 15 Hz, the fifth switching element SW15 may be switched on, and the other switching elements SW11 to SW14 and SW16 may be switched off. Accordingly, the amplitude of the vertical synchronization signal Vsync provided to the input pin GPIO1$a$ of the vertical synchronization signal information line Vsync1 may be regulated to become 1.0 V.

In addition, when the driving controller 100 controls the display to be driven at 1 Hz, the sixth switching element SW16 may be switched on, and the other switching elements SW11 to SW15 may be switched off. Accordingly, the amplitude of the vertical synchronization signal Vsync provided to the input pin GPIO1$a$ of the vertical synchronization signal information line Vsync1 may be regulated to become 0.8 V.

The driving frequencies and the regulated amplitudes of the vertical synchronization signal Vsync are merely illustrative, and may be set to various frequency levels and amplitudes as needed.

Figure 9:
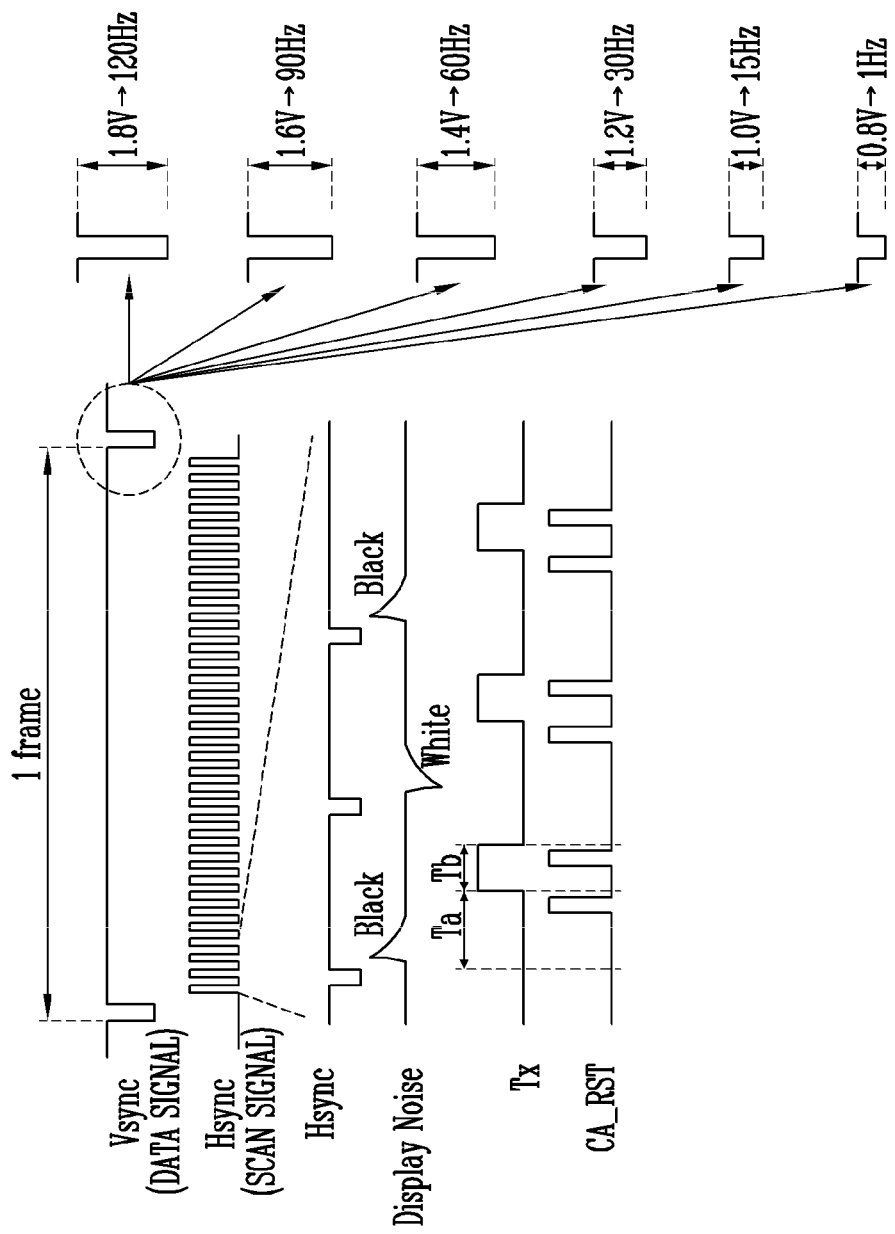
FIG. 9 is a timing diagram illustrating a driving method of the input controller in the display device in accordance with the present disclosure.

FIG. 9 is a timing diagram illustrating a driving method of the input controller in the display device in accordance with the present disclosure.

Referring to FIG. 9, as described above, the input controller 200 may receive the vertical synchronization signal having various amplitudes from the driving controller 100. The input controller 200 may determine at which frequency the driving controller 100 controls the display panel 10 through an amplitude of the vertical synchronization signal Vsync provided from the driving controller 100.

For example, when the amplitude of the vertical synchronization Vsync provided to the input controller 200 is 1.8 V, the input controller 200 may recognize that the driving controller 100 controls the display panel 10 to be driven at 120 Hz. Also, when the amplitude of the vertical synchronization Vsync provided to the input controller 200 is 1.6 V, the input controller 200 may recognize that the driving controller 100 controls the display panel 10 to be driven at 90 Hz. Also, when the amplitude of the vertical synchronization Vsync provided to the input controller 200 is 1.4 V, the input controller 200 may recognize that the driving controller 100 controls the display panel 10 to be driven at 60 Hz. Also, when the amplitude of the vertical synchronization Vsync provided to the input controller 200 is 1.2 V, the input controller 200 may recognize that the driving controller 100 controls the display panel 10 to be driven at 30 Hz. Also, when the amplitude of the vertical synchronization Vsync provided to the input controller 200 is 1.0 V, the input controller 200 may recognize that the driving controller 100 controls the display panel 10 to be driven at 15 Hz. Also, when the amplitude of the vertical synchronization Vsync provided to the input controller 200 is 0.8 V, the input controller 200 may recognize that the driving controller 100 controls the display panel 10 to be driven at 1 Hz.

In an embodiment, the input controller 200 may receive the vertical synchronization signal Vsync at least once per one frame. The input controller 200 may receive the horizontal synchronization signal Hsync at least equal to or greater than a number of scan lines per one frame.

In an embodiment, a period in which the input controller 200 provides a touch driving signal to the input sensor (see Tb in Tx shown in FIG. 9) may not overlap with a period in which the driving controller 100 provides a pulse of the vertical synchronization signal Vsync (a portion of Vsync having lower value) to the input controller 200 and the display panel 10 and/or a period in which the driving controller 100 provides a pulse of the horizontal synchronization signal Hsync (a portion of Hsync having lower value) to the input controller 200 and the display panel 10. For example, a phase (or a rising/falling transition time) of the touch driving signal may differ from phases (or rising/ falling transition times) of scan signals or data signals. In another example, the period in which the input controller 200 provides the touch driving signal to the input sensor may not overlap with a period in which the driving controller 100 provides scan signals to the display panel 10 and/or a period in which the driving controller 100 provides data signals to the display panel 10. That is, the period in which the input controller 200 provides the touch driving signal to the input sensor may not overlap with a period in which the driving controller 100 provides a voltage signal to the transistors TR1, TR2, and TR3 of the pixel PX in the display panel 10. The period Tb in which the input controller 200 provides the touch driving signal to the input sensor may not overlap with a period in which a light emitting state of the organic light emitting diode of the pixel PX is changed thereby display noise is occurred (see Display Noise and Tx, which are shown in FIG. 9). In the drawing, the display noise which deteriorates the touch driving signal from the display panel 10 is exemplified as noise occurring when a full-white data signal and a full-black data signal are alternately provided to pixel rows arranged in a column direction. The touch driving signal is considerably influenced by the noise when the full-white data signal and the full-black data signal are alternately provided to the pixel rows arranged in the column direction.

Although the driving frequency of the display panel 10 is altered, the influence of noise which deteriorate the touch driving signal from the display panel 10 can be minimized.

Meanwhile, the input controller 200 may initialize voltage levels of the touch sensing electrodes TE and RE. The input controller 200 may provide an initialization voltage signal CA_RST to each of the touch sensing electrodes TE and RE before the touch driving signal is provided to the touch sensing electrodes TE and RE and before the provision of the touch driving signal is ended. Accordingly, each of the touch sensing electrodes TE and RE may be initialized to a predetermined voltage level before the touch driving signal is provided to the touch sensing electrodes TE and RE and before the provision of the touch driving signal is ended. In an embodiment, a period in which the initialization voltage signal CA_RST is provided may not overlap with the period in which the driving controller 100 provides the pulse of the vertical synchronization signal Vsync and/or the period in which the driving controller 100 provides the pulse of the horizontal synchronization signal Hsync. At least a portion of the initialization voltage signal CA_RST may be overlap with the period in which the touch driving signal is provided.

Accordingly, the input sensor can accurately recognize a touch input of a user.

Although a case where the driving controller 100 varies the amplitude of the vertical synchronization signal Vsync and provides the varied amplitude of the vertical synchronization signal Vsync to the input controller 200 is described in this embodiment, those skilled in the art will achieve the same purpose by varying the amplitude of the vertical synchronization signal Vsync and providing the varied amplitude of the vertical synchronization signal Vsync to the input controller 200.

Next, a display device in accordance with another embodiment will be described. Hereinafter, components identical or similar to those shown in FIGS. 1 to 9 are designated by like reference numerals, and overlapping descriptions will be omitted.

Figure 10:
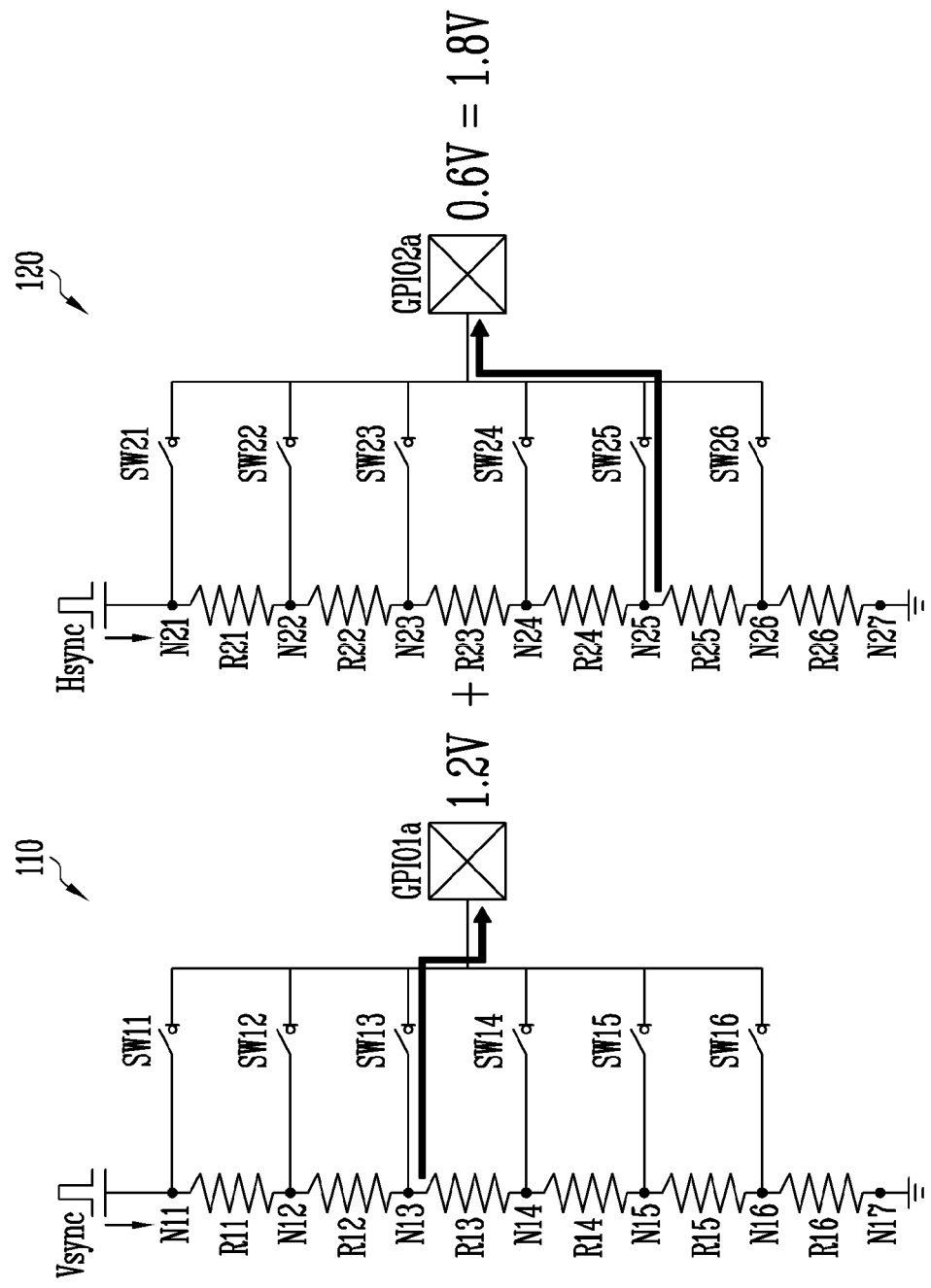
FIG. 10 is a circuit diagram illustrating a concept of a vertical synchronization signal voltage regulator and a horizontal synchronization signal voltage regulator in a driving controller in a display device in accordance with another embodiment of the present disclosure.

FIG. 10 is a circuit diagram illustrating a concept of a vertical synchronization signal voltage regulator and a horizontal synchronization signal voltage regulator in a driving controller in a display device in accordance with another embodiment of the present disclosure.

Referring to FIG. 10, the display device in accordance with this embodiment is different from the embodiment shown in FIG. 8, in that the input controller 200 determines a driving frequency by collecting both the amplitude of the vertical synchronization signal Vsync and the amplitude of the horizontal synchronization signal Hsync.

In an embodiment, the input controller 200 may determine a driving frequency of the display panel 10 by using both the amplitude of the vertical synchronization signal Vsync and the amplitude of the horizontal synchronization signal Hsync. For example, the input controller 200 may determine a driving frequency through the sum of the amplitude of the vertical synchronization signal Vsync and the amplitude of the horizontal synchronization signal Hsync.

In an embodiment, in the horizontal synchronization signal voltage regulator 120, a plurality of resistors R21 to R26 having a specific resistance value may be connected in series, and switching elements SW21 to SW26 may be connected between a node connecting adjacent resistors and the input pin GPIO2a of the horizontal synchronization signal information line Hsync1, respectively. Each of the switching elements SW21 to SW26 may be provided in the form of a thin film transistor, but the present disclosure is not limited thereto.

For example, in the horizontal synchronization signal voltage regulator 120, a first resistor R21 may be connected between a first node N21 and a second node N22, a second resistor R22 may be connected between the second node N22 and a third node N23, a third resistor R23 may be connected between the third node N23 and a fourth node N24, a fourth resistor R24 may be connected between the fourth node N24 and a fifth node N25, a fifth resistor R25 may be connected between the fifth node N25 and a sixth node N26, and a sixth resistor R26 may be connected between the sixth node N26 and a seventh node N27. The first node N21 may be a node electrically connected to an input terminal to which the horizontal synchronization signal Hsync is input, and the seventh node N27 may be a node electrically connected to a ground.

A first switching element SW21 may be connected between the first node N21 and the input pin GPIO2a of the horizontal synchronization signal information line Hsync1, a second switching element SW22 may be connected between the second node N22 and the input pin GPIO2a of the horizontal synchronization signal information line Hsync1, a third switching element SW23 may be connected between the third node N23 and the input pin GPIO2a of the horizontal synchronization signal information line Hsync1, a fourth switching element SW24 may be connected between the fourth node N24 and the input pin GPIO2a of the horizontal synchronization signal information line Hsync1, a fifth switching element SW25 may be connected between the fifth node N25 and the input pin GPIO2a of the horizontal synchronization signal information line Hsync1, and a sixth switching element SW26 may be connected between the sixth node N26 and the input pin GPIO2a of the horizontal synchronization signal information line Hsync1.

In an exemplary embodiment, the driving controller 100 may regulate the amplitude of the vertical synchronization signal Vsync to 1.2 V through the third switching element SW23 in the vertical synchronization signal voltage regulator 110, and regulate the amplitude of the horizontal synchronization signal Hsync to 0.6 V through the fifth switching element SW25 in the horizontal synchronization signal voltage regulator 120. The driving controller 100 may receive, from the input controller 200, the vertical synchronization signal Vsync of which amplitude is regulated to 1.2 V and the horizontal synchronization signal Hsync of which amplitude is regulated to 0.6 V, and recognize a driving frequency corresponding to a voltage 1.8 V as the sum of the amplitude of the vertical synchronization signal Vsync and the amplitude of the horizontal synchronization signal Hsync.

Figure 11:
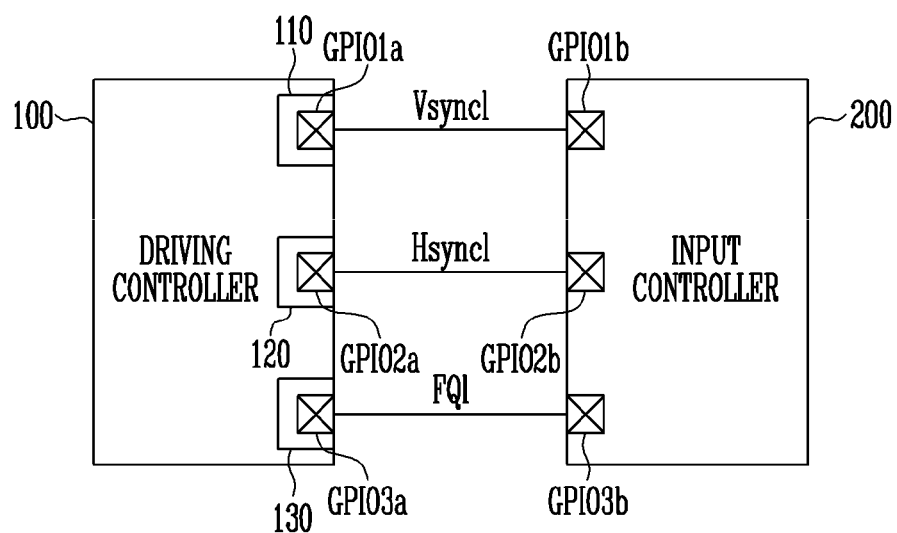
FIG. 11 is a block diagram illustrating a relationship between a driving controller and an input controller in a display device in accordance with still another embodiment of the present disclosure.

FIG. 11 is a block diagram illustrating a relationship between a driving controller and an input controller in a display device in accordance with still another embodiment of the present disclosure.

Referring to FIG. 11, the display device in accordance with this embodiment is different from the embodiment shown in FIG. 7, in that the signal lines connecting the driving controller 100 and the input controller 200 further include a frequency information line FQ1.

The frequency information line FQ1 may be connected in a manner that input/output pins GPIO3a and GPIO3b disposed at both end portions thereof are respectively coupled to the input controller 200 and the driving controller 100.

The frequency information line FQ1 may transmit a binary signal according to a driving frequency of the driving controller 100. For example, when the driving frequency is a first frequency, a signal of '0' may be transmitted through the frequency information line FQ1. When the driving frequency is a second frequency different from the first frequency, a signal of '1' may be transmitted through the frequency information line FQ1.

A frequency information line regulator 130 may regulate whether the signal of '0' or the signal of '1' is to be transmitted through the frequency information line FQ1.

Accordingly, the input controller 200 can easily recognize two specific frequencies at which the driving controller 100 controls the display to be driven.

In accordance with the present disclosure, the accuracy of recognition of whether a touch occurs or calculation of a touch coordinate can be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device including a display panel including a plurality of pixels, and an input sensor for sensing an input of a user, comprising:
   a driving controller configured to provide the display panel with a scan signal and a data signal according to a driving frequency;
   an input controller configured to provide a touch driving signal to the input sensor; and
   a vertical synchronization signal information line connecting the driving controller and the input controller, the vertical synchronization signal information line transmitting a vertical synchronization signal therethrough,
   wherein amplitude of the vertical synchronization signal varies according to the driving frequency, and
   the amplitude of the vertical synchronization signal has a first amplitude when the driving frequency is a first frequency and has a second amplitude which is less than the first amplitude when the driving frequency is a second frequency which is less than the first frequency.

2. The display device of claim 1, wherein a period in which the touch driving signal is provided does not overlap with a period in which a period in which the vertical synchronization signal is provided.

3. The display device of claim 1, wherein a period in which the touch driving signal is provided does not overlap with a period in which the scan signal is provided and a period in which the data signal is provided.

4. The display device of claim 1, wherein the driving frequency has a plurality of driving frequencies, and
   wherein the amplitude of the vertical synchronization signal or the horizontal synchronization signal which varies according to the driving frequency has a predetermined value.

5. The display device of claim 4, wherein the driving frequency varies in a range of 1 Hz to 120 Hz.

6. The display device of claim 1, wherein the driving controller includes a vertical synchronization signal voltage regulator which alters the amplitude of the vertical synchronization signal, the vertical synchronization signal voltage regulator being electrically connected to one end portion of the vertical synchronization signal information line.

7. The display device of claim 6, wherein the vertical synchronization signal voltage regulator includes a plurality of resistors connected in series and a plurality of switching elements electrically connected between the one end portion of the vertical synchronization signal information line and nodes disposed between adjacent resistors, respectively.

8. The display device of claim 1, wherein the input sensor includes a touch driving electrode to which the touch driving signal is provided and a touch sensing electrode from which a touch sensing signal is received, and
   wherein the touch driving electrode and the touch sensing electrode intersect each other while being insulated from each other.

9. The display device of claim 8, wherein an initialization voltage signal for allowing the touch driving electrode to be initialized to a predetermined voltage level is provided before the touch driving signal is provided to the touch driving electrode and before the provision of the touch driving signal is ended.

10. The display device of claim 8, wherein the touch driving electrode and the touch sensing electrode are disposed in the same layer.

11. The display device of claim 10, wherein any one of the touch driving electrode and the touch sensing electrode is electrically connected to the other of the touch driving electrode and the touch sensing electrode through a bridge pattern disposed in another layer at a position at which the touch driving electrode and the touch sensing electrode intersect each other.

12. The display device of claim 1, wherein both the amplitudes of the vertical synchronization signal and the horizontal synchronization signal vary.

13. The display device of claim 12, wherein the sum of the amplitude of the vertical synchronization signal and the amplitude of the horizontal synchronization signal has a first amplitude when the driving frequency is a first frequency and has a second amplitude which is less than the first amplitude when the driving frequency is a second frequency which is less than the first frequency.

14. The display device of claim 1, further comprising a frequency information line connecting the driving controller and the input controller, the frequency information line transmitting a binary signal therethrough,
wherein the frequency information line transmits a signal of '0' when the driving frequency is a first frequency, and transmits a signal of '1' when the driving frequency is a second frequency different from the first frequency.

15. The display device of claim 1, further comprising a horizontal synchronization signal information line connecting the driving controller and the input controller, the horizontal synchronization signal information line transmitting a horizontal synchronization signal therethrough,
wherein amplitude of the horizontal synchronization signal varies according to the driving frequency, and
the amplitude of the horizontal synchronization signal has a third amplitude when the driving frequency is the first frequency and has a fourth amplitude which is less than the third amplitude when the driving frequency is the second frequency.

16. A display device comprising:
a base substrate;
a display panel, the display panel including:
a TFT circuit layer disposed on the base substrate, the TFT circuit layer including a plurality of transistors;
a light emitting device layer disposed on the TFT circuit layer, the light emitting device layer including a light emitting diode electrically connected to at least some of the plurality of transistors; and
an encapsulation layer disposed on the light emitting device layer;
an input sensing layer including a first touch conductive layer, a first touch insulating layer and a second touch conductive layer which are sequentially stacked on the encapsulation layer; and
a window substrate disposed on the input sensing layer,
wherein a period in which a touch driving signal is provided to the input sensing layer does not overlap with a period in which a pulse of the vertical synchronization signal is provided to the display panel, and
the amplitude of the vertical synchronization signal has a first amplitude when the touch driving frequency is a first frequency and has a second amplitude which is less than the first amplitude when the touch driving frequency is a second frequency which is less than the first frequency.

17. The display device of claim 16, wherein the voltage signal provided to the plurality of transistors includes a scan signal and a data signal.

18. The display device of claim 17, wherein the touch driving electrode and the touch sensing electrode are mesh-shaped patterns, and include an opaque conductive material.

19. The display device of claim 16, wherein the input sensing layer includes a touch driving electrode to which the touch driving signal is provided and a touch sensing electrode from which a touch sensing signal is received, and
wherein the touch driving electrode and the touch sensing electrode are disposed in the second touch conductive layer.

20. The display device of claim 16, wherein the input sensing layer is patterned directly on the encapsulation layer to form an on-cell type input sensing layer.

21. The display device of claim 16, wherein
the amplitude of the horizontal synchronization signal has a third amplitude when the touch driving frequency is the first frequency and has a fourth amplitude which is less than the third amplitude when the touch driving frequency is the second frequency.

* * * * *